United States Patent
Le Torc'h

(12) 
(10) Patent No.: US 6,483,827 B1
(45) Date of Patent: Nov. 19, 2002

(54) DECT-BASED RADIO STATION

(75) Inventor: Adre Le Torc'h, Concarneau (FR)

(73) Assignee: EADS Defence and Security Networks, Montigny-le-Bretonneux (FR)

( * ) Notice: Subject to any disclaimer, the term of this patent is extended or adjusted under 35 U.S.C. 154(b) by 0 days.

(21) Appl. No.: 09/497,382

(22) Filed: Feb. 3, 2000

(51) Int. Cl.$^7$ .................................. H04Q 7/20

(52) U.S. Cl. ........................................ 370/337; 455/462

(58) Field of Search ................................. 370/328, 337, 370/321, 347, 442, 503, 506, 345; 455/426, 462, 464

(56) References Cited

U.S. PATENT DOCUMENTS 6,226,515 B1 * 5/2001 Dauli et al. .................. 455/426
6,289,218 B1 * 9/2001 Liu ............................. 455/426

FOREIGN PATENT DOCUMENTS

EP       0 841 830 A1 *  5/1998  ........... H04Q/11/04

OTHER PUBLICATIONS

<<Digital Enhanced Cordless Telecommunications (DECT); Common Interface (CI); Physical Layer (PHL)>>, European Standard EN 300175–2, Version 1.4.2, European Telecommunications Standards Institute (ETSI), pp. 1–46.

* cited by examiner

Primary Examiner—Douglas Olms
Assistant Examiner—Ken Vanderpuye
(74) Attorney, Agent, or Firm—McCracken and Frank

(57) ABSTRACT

The radio station has DECT circuitry for processing one or more bit streams to be transmitted over a communication channel divided into successive 10 ms radio frames each having a plurality of timeslots, each bit stream being allocated one of the timeslots in each frame. The DECT circuitry extracts bit sequences from each bit stream and modulates each of the bit sequences to form a respective radio signal burst inserted into a timeslot allocated to the bit stream in accordance with DECT formats. A clock generator, including a crystal oscillator and frequency dividers, produces a first clock signal having a frequency adapted for set the bit rate of each bit stream to 32 kbit/s, and a second clock signal having a frequency adapted for setting the bit rate within each bit sequence to 1.024 kbit/s, whereby the DECT formats remain valid while the channel has a reduced spectra bandwidth.

9 Claims, 3 Drawing Sheets

DECT-BASED RADIO STATION

BACKGROUND OF THE INVENTION

The present invention relates to digital radio communications using time-division multiple access (TDMA).

In a TDMA system, a communication channel is divided into successive radio frames and each radio frame is divided into a plurality of timeslots. Multiplexed channels are formed over the communication channel by allocating the timeslots in each frame.

A TDMA radio system of widespread use is the so-called DECT system ("Digital Enhanced Cordless Telecommunications"), which has been standardized by the European Telecommunications Standards Institute (ETSI). The DECT technology is used in various sectors, including residential telephony, business communications, and public access to other networks.

The DECT operating frequency band is 1,880–1,900 MHz. Each communication channel (one carrier frequency, or more if frequency hopping is provided) can support up to 12 full duplex channels, the frame duration being 10 ms. In a typical application, each channel has an information bit rate of 32 kbit/s in each direction, suitable for transmitting, e.g., a digital speech signal produced by an adaptive differential pulse code modulation (ADPCM) source. Due to the TDMA operation, the 32 kbit/s bit stream is split into 320-bit sequences distributed into the allocated timeslots of the successive frames, along with system and signaling information, the instantaneous bit rate within the timeslots being 1.152 MHz. Gaussian frequency shift keying (GFSK) is used to form the modulated radio signal bursts from those bit sequences.

Owing to the ETSI standardization, various manufacturers have designed DECT components and produce them at relatively low cost. In particular, the burst mode controller (BMC) is the digital circuitry used in the DECT physical layer to control the production of the radio signal from the different bit streams to be transmitted. All details about the DECT physical layer may be found in the ETSI Standard EN 300 175-2, *Digital Enhanced Cordless Telecommunications (DECT); Common Interface (CI); Part 2: Physical Layer (PHL)*, version 1.4.2, June 1999, which is incorporated herein by reference.

FIG. 1 is an illustration of the conventional DECT frame structure. There are 24 timeslots per frame, i.e. 12 slots for the downlink (fixed part to portable part) followed by 12 slots for the uplink (portable part to fixed part). Each timeslot is 416.7 $\mu$s long, which represents 480 bit periods. In a typical embodiment, each timeslot may support the transmission of a signal burst obtained by modulating a sequence of 440 bits (381.9 ps) including 48 synchronization bits (S-field), 388 information bits (D-field) and 4 additional bits (Z-field). The D-field includes 64 bits for signaling (A-field), 320 bits for traffic (B-field), e.g. from the ADPCM coder, and 4 additional bits for error detection (X-field). A guard time of 34.7 $\mu$s (40 bit periods) is left after the burst at the end of the time slot to account for the propagation time between the FP end the PP and to enable switching of the carrier frequency if required. In another possible timeslot format, the A-field has only 32 bits, whereby the guard time is longer (56 bit periods).

In a number of applications, the spectral bandwidth, which can be used about a particular carrier frequency, is narrower than what has been provided for in the DECT standards. In particular, the United States Federal Communications Commission (FCC) has issued spectral specifications for wireless telecommunications in the 2.4 GHz range. Those specification require for each channel a maximum spectral bandwidth of about 1 MHz. When such requirement applies, the DECT system as it exists cannot be simply transposed because of the aforesaid 1.152 MHz instantaneous bit rate in the timeslots, which leads to spectral bandwidths significantly broader than 1 MHz.

For such applications, it would be desirable to use DECT components, whose design is well adapted to cordless applications and which are available at relatively low cost. In order to adapt DECT components to those requirements, a possibility is to use a quartz crystal having a lower oscillation frequency as a time reference by the BMC. Reducing the quartz frequency by a factor $\alpha$ ($\alpha$ 1) reduces the bit rate within the timeslots to 1.152/$\alpha$MHz. A problem with this approach is that the timeslot pertaining to each channel, which contains 320 traffic bits, occurs every 10×$\alpha$ms, so that the rate of the input bit stream has to be changed from 32 kbit/s to 32/$\alpha$kbit/s. This implies the need to provide data and clock conversion for synchronization with other units. Changing the output bit rate of an ADPCM coder from 32 kbit/s to 32/$\alpha$kbit/s corresponds to changing the sampling frequency of the speech signal from 8 to 8/$\alpha$kHz. Therefore, the above-mentioned conversion implies converting the coded speech signal into analog form and re-sampling it at 8/$\alpha$ or 8 kHz. Such conversion significantly increases the complexity of the system. In addition, it is very difficult to synchronize several base stations together (as required in the DECT system in order to support the handover feature) when such base stations are connected to a switching system, e.g. PBX, because such systems typically transport standard 32 kbit/s ADPCM signals, and use a corresponding 8 kHz reference clock for synchronization.

Another possibility, which overcomes the above problems, is to divide the channel bit rate by an integer number (e.g. 2 or 3), while multiplying the timeslot duration by a corresponding number and keeping the 10 ms duration of the frames (with correspondingly less slots). Although this solution is simpler, it has the drawbacks of significantly increasing the power consumption of the portable units and decreasing the number of channels available for multiplexing.

An object of the present invention is to propose another, more convenient, approach to adapt the DECT technology to narrower spectral bandwidths.

SUMMARY OF THE INVENTION

A radio station according to the invention comprises DECT circuitry for processing at least one bit stream to be transmitted over a communication channel comprising successive 10 ms radio frames each having a plurality of timeslots, each bit stream being allocated one of said plurality of timeslots in each frame. The DECT circuitry comprises means for extracting bit sequences from each bit stream and means for modulating each of said bit sequences to form a respective radio signal burst inserted into a timeslot allocated to said bit stream in accordance with DECT formats. Each bit stream has a first bit rate controlled by a first clock signal and each of said bit sequences has a second bit rate controlled by a second clock signal. Clock generation means are provided for producing the first and second clock signals having frequencies adapted for said first and second bit rate to be substantially 32 and 1.024 kbit/s, respectively. The number of transmit timeslots per frame will be at most 10, preferably 9 or 10.

DESCRIPTION OF PREFERRED EMBODIMENTS

In accordance with the invention, the DECT frame is modified in order to lower the bit rate of the modulating signal and hence the spectral bandwidth of the transmitted radio signal. With respect to the 1.152 MHz bit rate of the DECT standards, a 8/9 reduction is applied so that the bit rate is 1.024 MHz. The 1.024 MHz bit clock signal BCK is generated by a frequency divider 1 which divides by N the frequency of an oscillation signal OS produced by a crystal oscillator 2 (FIG. 2).

In a preferred embodiment, N=9, and the frequency of the crystal oscillator 2 is 9.216 MHz.

The bit clock signal BCK is addressed to another frequency divider 3 which divides its frequency by 128 to provide a 8 kHz reference clock signal RCK. A phase-locked loop (PLL) arrangement is provided to align the phase of the latter signal RCK with that of an external synchronization signal SCK which, as usual in DECT systems, consists of a 8 kHz system clock.

Figure 2:
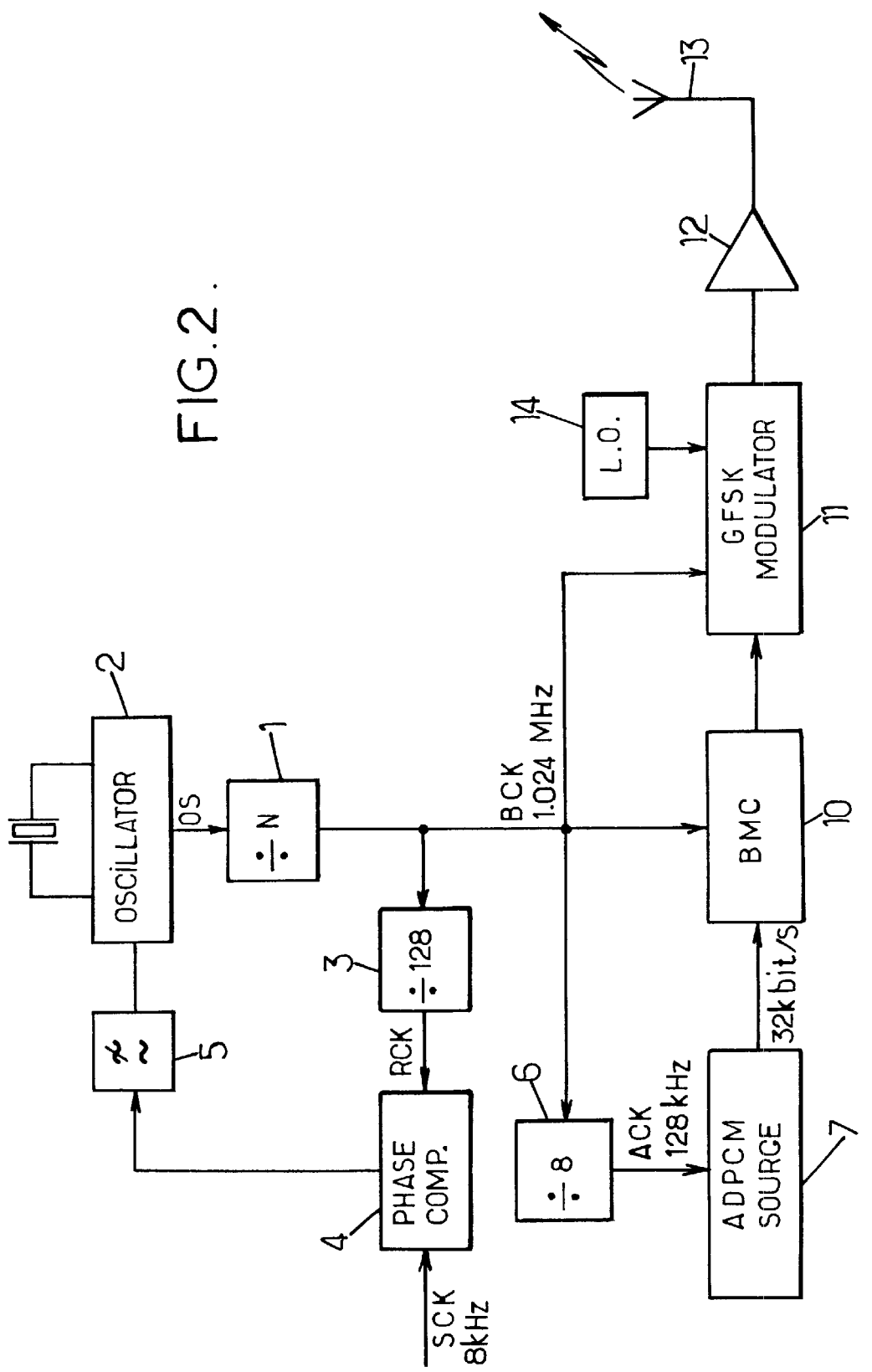
FIG. 2 is a block diagram of a the transmitter part of a radio station according to the present invention.

In the case where the transmitter of FIG. 2 belongs to a fixed part (FP) connected to a switching system, e.g. PBX, the system clock SCK is typically provided by the switching system. The same clock is addressed to different FP's (base stations) to enable handover between them. If the transmitter belongs to a portable part (PP), the system clock may be retrieved in conventional manner from the bit rate sensed in the radio signal received on the air interface.

The PLL has a phase comparator 4 to compare the phases of signals RCK and SCK, and a low-pass filter 5 to adjust oscillator 2 so as to minimize the phase difference measured by comparator 4. Such conventional PLL arrangement ensures the synchronization of the station with the system clock. Alternatively, by virtue of the 8/9 ratio, the PLL can easily be implemented by means other than traditional hardware design.

A further frequency divider 6 divides by 8 the frequency of the bit clock signal BCK to produce a 128 kHz clock ACK for the ADPCM source 7 of the station. The ADPCM source 7 delivers a 32 kbit/s bit stream representing a speech signal. Such source 7 may be an ADPCM coder, for example in the case of a PP. It may also be a synchronous interface receiving the bit stream from another unit (e.g. wire interface in the case of a FP connected to a PBX). It will be noted that the 32 kbit/s stream could be produced by a source other than ADPCM, such as a data source.

FIG. 2 shows a simple embodiment where only one 32 kbit/s bit stream is fed to the burst mode controller (BMC) 10 for transmission. Those skilled in the art will appreciate that the BMC may also receive several such streams and multiplex them into several TDMA channels over the air interface, for example in the following circumstances:

several 32 kbit/s streams may correspond to several communications multiplexed by the FP;

a communication may use distinct 32 kbit/s streams, or a stream of higher rate (e.g. a 64 kbit/s PCM stream), split into several 32 kbit/s streams multiplexed by the BMC.

The BMC 10 performs a segmentation of the 32 kbit/s bit stream(s) into sequences of 320 bits, adds signaling and system bits to those sequences to form binary signal bursts having DECT formats with a timing controlled according to the TDMA frame structure, and delivers those bursts to the GFSK modulator 11. In a conventional manner, the modulator 11 produces a radio signal which is amplified by the power amplifier 12 and transmitted from the antenna 13.

The burst mode controller (BMC) 10 and GFSK modulator 11 are DECT components quite similar to those used in standard 1,880–1,900 MHz applications. In order to use them in the 2.4 GHz band, the RF frequency addressed to the modulator 11 by the local oscillator 14 is increased. The use of a 1.024 kbit/s bit rate in the signal bursts reduces the spectral bandwidth of the radio signal to about 1 MHz. The programming of the BMC is adapted to take into account a modified frame structure such as that shown in FIG. 3. This may be done by configuring the dedicated instruction processor (DIP) of the BMC.

Figure 1:
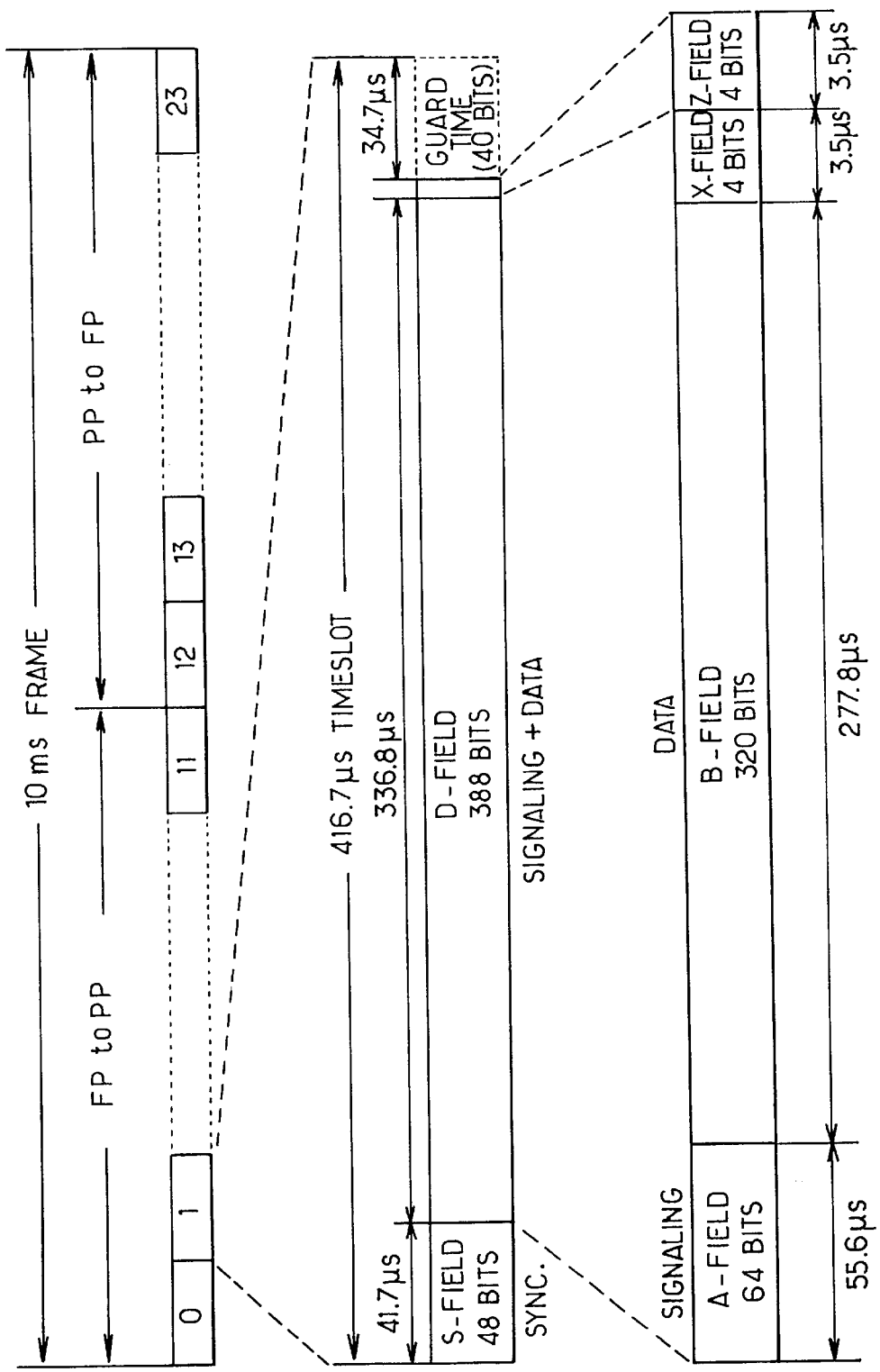
FIG. 1 is a diagram illustrating a conventional DECT frame structure.
Figure 3:
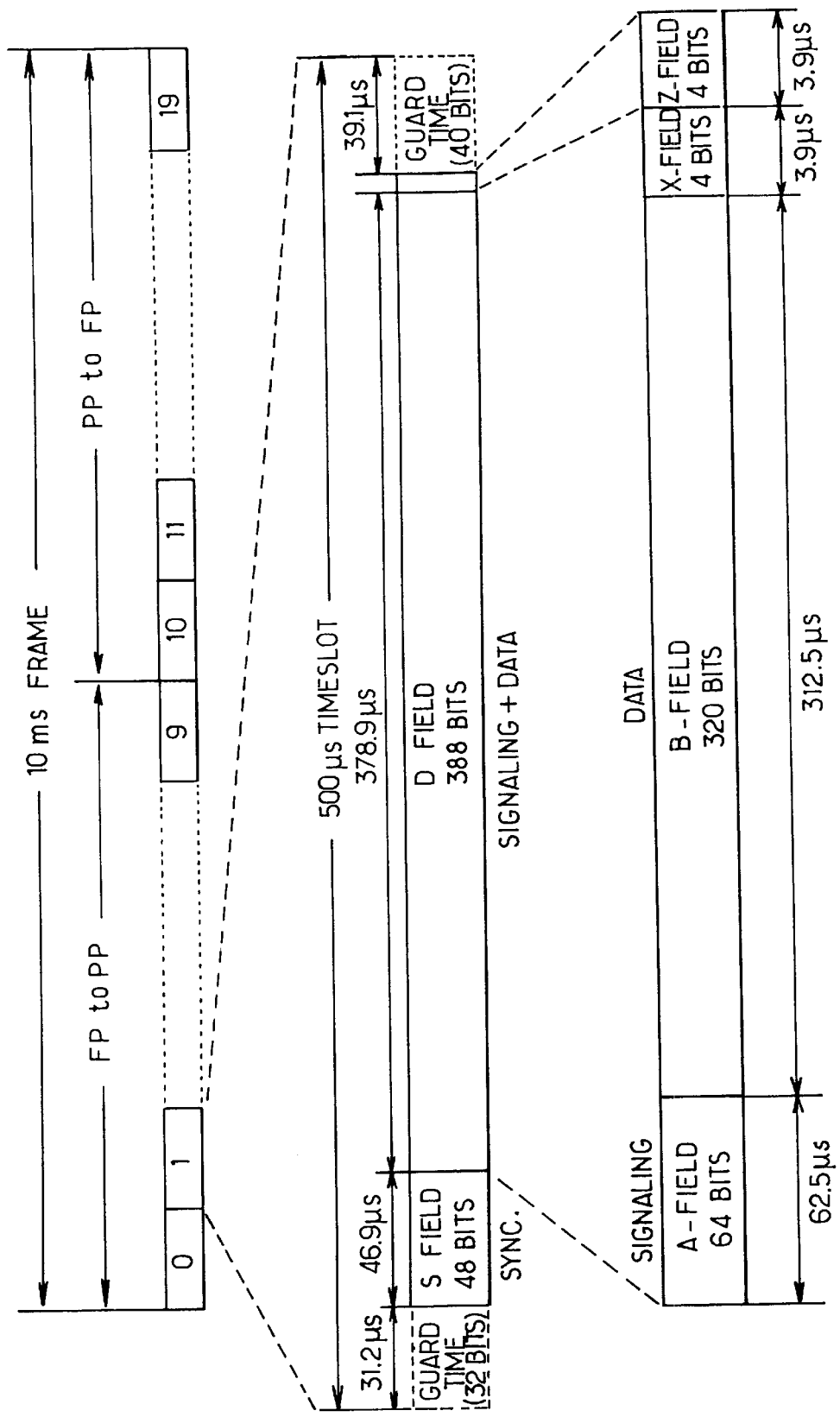
FIG. 3 is a diagram illustrating a DECT frame structure as adapted according to an embodiment of the present invention.

In the embodiment illustrated by FIG. 3, the transmitter has 10 timeslots per frame to form up to 10 multiplexed channels. The 10 ms frame is divided into 20 timeslots, i.e. 10 for the downlink (0 to 9) and 10 for the uplink (10 to 19). Hence, the timeslot duration is 500 $\mu$s. A 31.25 $\mu$s guard time (32 bit periods) is inserted at the beginning of each slot, and the remaining 468.75 $\mu$s=(9/8)×416.7 $\mu$s have exactly the same contents as a conventional DECT timeslot, taking into account the 8/9 rescaling of the bit clock. Therefore, the timeslot illustrated in FIG. 3 has, after the initial guard time of 32 bit periods, the same fields as in FIG. 1, each having the same number of bits and a duration multiplied by 9/8.

The BMC 10 generates the frame structure by counting cycles of the 1.024 MHz bit clock BCK, the sole modifications with respect to the conventional DECT case being the insertion of the additional 32 bit guard time in each timeslot, and the different number of timeslots per frame.

The total 39.1+31.2=70.3 $\mu$s guard time between two consecutive signal bursts may be exploited to switch the RF frequency if necessary.

If the RF part of the station is not sufficiently agile, it is possible to reduce the number of timeslots per frame. For example, multiplexing up to 9 duplex channels will require 9 timeslots per frame in each direction, with a timeslot duration of 555.6 $\mu$s. The average initial guard time will then be 86.8 $\mu$s, representing 88+(8/9) bit periods. For 8 of the 9 timeslots of the frame (for each direction), the initial guard time will correspond to 89 bit periods (86.9 $\mu$s), and for the remaining timeslot it will correspond to 88 bit periods (85.9 $\mu$s). A suitable programming of the BMC counters readily provides such timing from the bit clock.

Further reductions of the number of timeslots per frame are possible. However, they are detrimental to the multiplexing capacities of the base stations.

The radio transmitter of FIG. 2 is easily adapted to form part of a dual-band DECT radio station in which the local oscillator frequency can be selected to be in the conventional 1.9 GHz range or in the 2.4 GHz range. A selection of the bit clock frequency between the values 1.152 MHz (1.9 GHz case) and 1.024 MHz (2.4 GHz case) is performed by selecting the ratio N, applied to the 9.216 MHz clock by the frequency divider 1, between the values 8 and 9, respectively. The adaptation required in the BMC is very simple: a dedicated instruction processor (DIP) is programmed to set the number of duplex channels per frame and the number L of bit periods of the initial guard time within each slot as follows:

in the 1.9 GHz case, K 12, L =0 and in the 2.4 GHz case, K10, L=and/or K=9, L=88 or 89.

What is claimed is:

1. A radio station, comprising:

DECT circuitry for processing at least one bit stream to be transmitted over a communication channel comprising successive 10 ms radio frames each having a plurality of timeslots, each bit stream being allocated one of said plurality of timeslots in each frame, the DECT circuitry comprising means for extracting bit sequences from each bit stream and means for modulating each of said bit sequences to form a respective radio signal burst inserted into a timeslot allocated to said bit stream in accordance with DECT formats, wherein each bit stream has a first bit rate controlled by a first clock signal and each of said bit sequences has a second bit rate controlled by a second clock signal; and clock generation means for producing the first and second clock signals having frequencies adapted for said first and second bit rate to be substantially 32 kbit/s and 1.024 kbit/s, respectively.

2. The radio station of claim 1, wherein the number of transmit timeslots per frame is 9 or 10.

3. The radio station of claim 1, wherein the clock generation means comprise:

a crystal oscillator providing an oscillation signal;

first frequency division means for producing said second clock signal from said oscillation signal; and second frequency division means for producing said first clock signal from said second clock signal.

4. The radio station of claim 3, wherein said crystal oscillator has a frequency of substantially 9.216 MHz, and wherein a frequency division factor applied by said first frequency division means is 9.

5. The radio station of claim 3, wherein said first frequency division means are arranged to apply a selected one of first and second frequency division factors, whereby selection of the first frequency division factor yields said second bit rate of substantially 1.024 kbit/s and selection of the second frequency division factor yields a modified second bit rate of substantially 1.152 kbit/s, suitable for DECT transmission with 12 transmit timeslots per frame.

6. A radio station as claimed in claim 5, wherein the first frequency division factor is 9 and the second frequency division factor is 8.

7. The radio station of claim 3, wherein the clock generation means further comprise third frequency division means for producing a third clock signal from said second clock signal, said third clock signal being used for synchronizing the radio station with external units.

8. The radio station of claim 7, wherein a frequency division factor applied by said third frequency division means is 128.

9. The radio station of claim 7, further comprising phase lock loop means for comparing said third clock signal with an external synchronization signal and controlling the crystal oscillator in response to the comparison.

* * * * *